United States Patent [19]

Morrison, Jr.

[11] 4,162,954
[45] Jul. 31, 1979

[54] PLANAR MAGNETRON SPUTTERING DEVICE

[75] Inventor: Charles F. Morrison, Jr., Boulder, Colo.

[73] Assignee: Vac-Tec Systems, Inc., Boulder, Colo.

[21] Appl. No.: 935,358

[22] Filed: Aug. 21, 1978

[51] Int. Cl.² ............................................ C23C 15/00
[52] U.S. Cl. .................................................. 204/298
[58] Field of Search ................ 204/192 R, 192 C, 298

[56] References Cited
U.S. PATENT DOCUMENTS

| | | | |
|---|---|---|---|
| 3,878,085 | 4/1975 | Corbani | 204/298 |
| 3,956,093 | 5/1976 | McLeod | 204/192 |
| 4,060,470 | 11/1977 | Clarke | 204/192 R |
| 4,100,055 | 7/1978 | Rainey | 204/298 |
| 4,116,806 | 9/1978 | Love et al. | 204/298 |

OTHER PUBLICATIONS

T. Van Vorous, "Planar Magnetron Sputtering; a New Industrial Coating Technique", *Solid State Technology*, Dec. 1976, pp. 62–66.

J. S. Chapin, "The Planar Magnetron", *Research/Development*, Jan. 1974, pp. 37–40.

J. A. Thornton, "Magnetron Sputtering: Basic Physics & Application to Cylindrical Magnetrons", *J. Vac. Sci. Technol.*, pp. 171–177 (1978).

Product Literature, "Dynamic Planar Magnetron Sputtering Source", Sloan Technology Corp., Santa Barbara, Calif. (1977).

*Primary Examiner*—Aaron Weisstuch
*Attorney, Agent, or Firm*—Gerald J. Ferguson, Jr.; Joseph J. Baker

[57] ABSTRACT

A planar magnetron sputtering device where the magnetic lines of force pass through the center of the planar cathode at angles of 45° or less with respect to the planar surface of the cathode to thereby promote uniformity of cathode erosion. The magnetic structure may comprise mangetic tape stacked or rolled to form a solid, flat coil parallel to the cathode where at least some of the tape is tipped or slanted with respect to the cathode. Other magnetic structures are also disclosed which promote uniformity of cathode erosion.

42 Claims, 14 Drawing Figures

FIG. 5
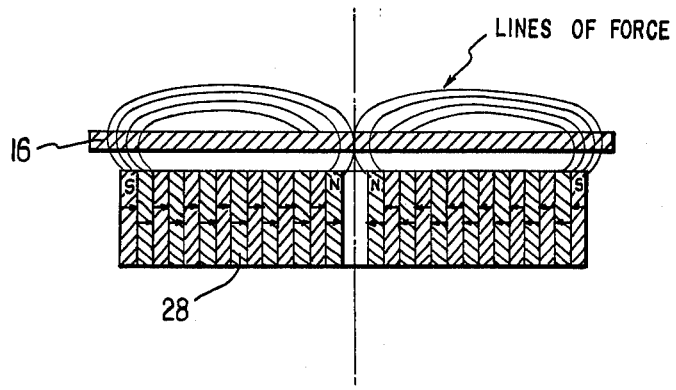
FIG. 6
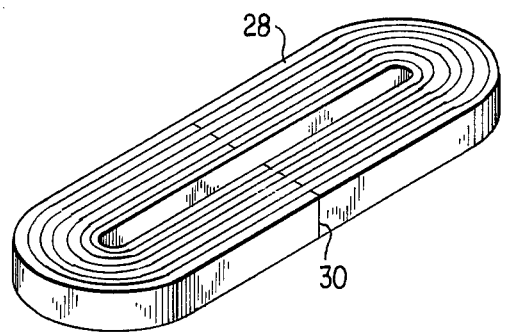
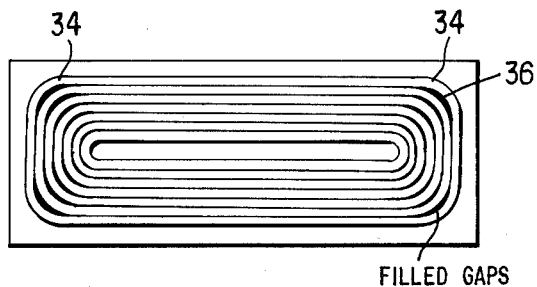
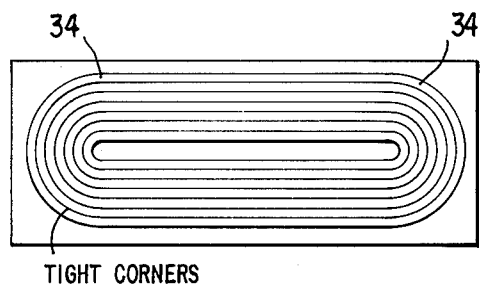
FIG. 7 FIG. 8
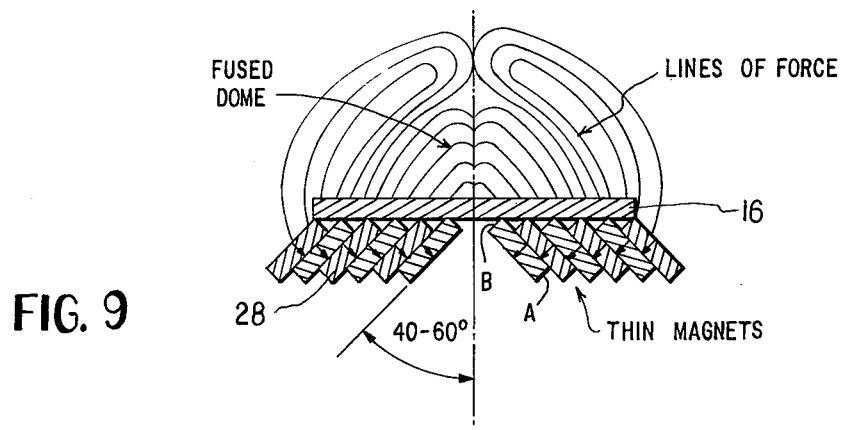
FIG. 9

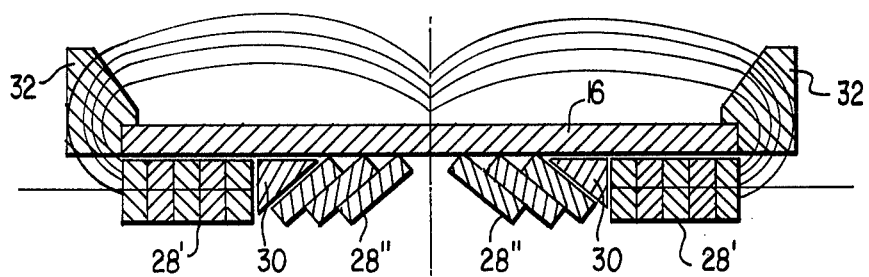
FIG. 10
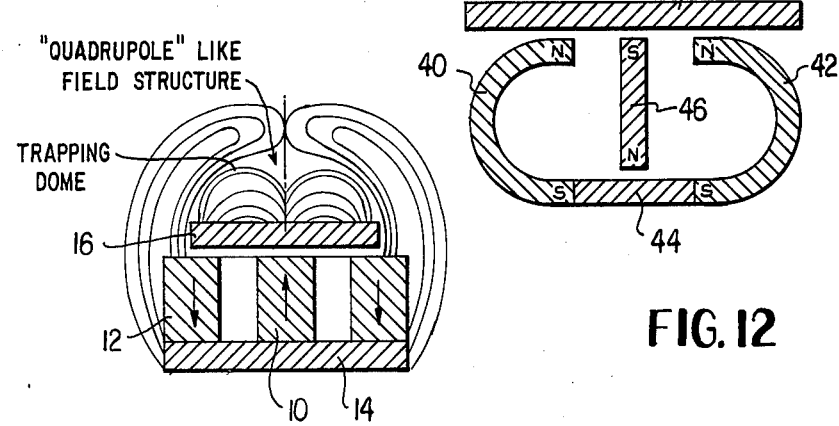
FIG. 11
FIG. 12
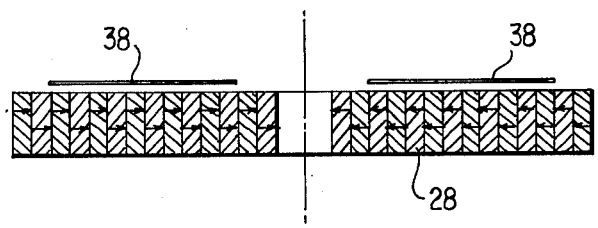
FIG. 13
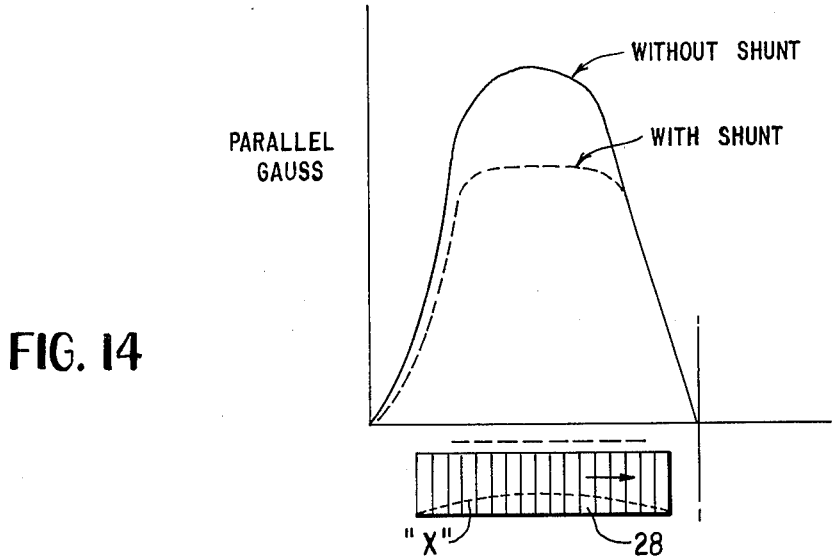
FIG. 14

PLANAR MAGNETRON SPUTTERING DEVICE

BACKGROUND OF THE INVENTION

1. Field of the Invention:

This invention relates to planar magnetron sputtering devices.

2. Discussion of Prior Art:

FIGS. 1 and 2 are cross-sectional and perspective views respectively of a representative prior art planar magnetron sputtering device comprising inner magnet 10 and outer magnet 12 (both of which usually comprise a number of sections) where the magnets are shunted by an iron pole plate 14. Disposed above the magnetic structure is a cathode or target 16 (not shown in FIG. 2). The magnetic lines of force are as shown in FIG. 1 where they exit from and return through cathode 16, a similar technique being employed in U.S. Pat. No. 3,878,085, where the magnetic lines also enter and exit from the cathode surface.

An electric field is established between (a) a ring-like anode 17, which may be disposed around and spaced from cathode 16, (or the chamber wall may serve this function) and (b) the cathode whereby electrons are removed from the cathode. Due to the configuration of the lines of magnetic force (the illustration of which is approximate), the removed electrons tend to concentrate in regions A where the lines of force are substantially parallel to the upper surface of target 16. There the electrons ionize gas particles which are then accelerated to the target to dislodge atoms of the target material. The dislodged target material then typically deposits as a coating film on an object to be coated. Assuming the object to be coated is in strip form or is mounted on a strip moving in the direction of the arrow shown in FIG. 2, the object will be uniformly coated, the strip being narrower in width than the length of the sputtering device.

Once the ionizing electrons are removed from the target, they travel long paths because they circulate in a closed loop defined between inner magnet 10 and outer magnet 12, the loop being above target 16. Hence, the electrons are effective in ionizing the gas particles. However, since most of the ionizing electrons are concentrated in regions A, the ionized gas particles will mainly erode cathode 16 in regions A'. Such uneven disintegration of the target is undesirable in that the target materials are most often extremely pure and accordingly, very expensive.

Another prior art arrangement is shown in cross-section in FIG. 3 where parallel magnets 18 and 20 are employed with pole pieces 22 and 24. However, this configuration is essentially the same as that of FIGS. 1 and 2 in its function and is subject to the same shortcomings.

SUMMARY OF THE INVENTION

It is an important object of this invention to provide an improved planar magnetron sputtering device wherein the target is more uniformly disintegrated.

It is a further object of this invention to provide an improved planar magnetron sputtering device of small dimensions and high power output.

Other objects and advantages of this invention will be apparent from a reading of the following specification and claims taken with the drawing.

BRIEF DESCRIPTION OF THE DRAWING

FIG. 5 is a cross-sectional view of an illustrative magnetic structure in accordance with a preferred embodiment of the invention.

FIG. 6 is a perspective view of an illustrative stacked, flexible magnetic tape for implementing the structure of FIG. 5.

FIGS. 7 and 8 are plan views of stacked magnetic structures illustrating different corner arrangements thereof.

FIGS. 9 and 10 are cross-sectional views of illustrative embodiments of further, preferred magnetic structures in accordance with the invention.

FIG. 11 is an illustrative embodiment of a magnetic structure applicable to small cathodes in accordance with an important aspect of the invention.

FIG. 12 is a cross-sectional view of a further embodiment of a magnetic structure applicable to small cathodes.

FIG. 13 is a cross-sectional view of an illustrative embodiment of a further, preferred embodiment of the invention.

FIG. 14 illustrates (a) a graph showing the flux distribution established by the structure of FIG. 13 and (b) a cross-sectional view of an illustrative embodiment of a further, preferred embodiment of the invention.

DETAILED DESCRIPTION OF THE DIFFERENT EMBODIMENTS OF THE INVENTION

Figure 1:
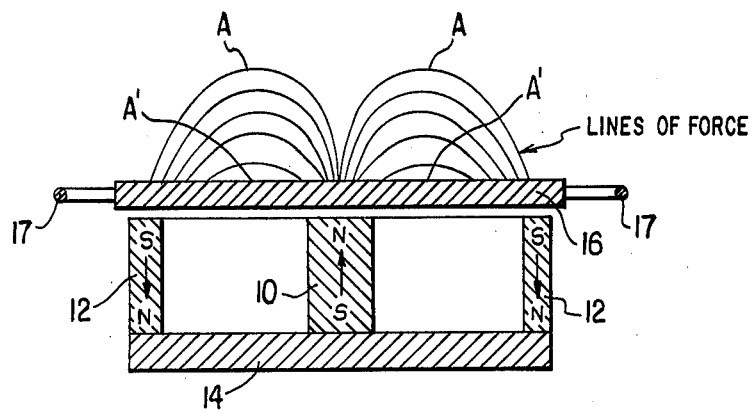
FIGS. 1 and 2 are cross-sectional and perspective views, respectively, of a prior art planar magnetron sputtering device.

Reference should be made to the drawing where like numerals refer to like parts.

Figure 4:
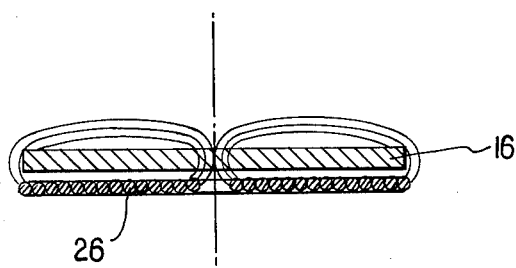
FIG. 4 is a cross-sectional view of an illustrative magnetic structure in accordance with a presently, non-preferred embodiment of the invention.

In FIG. 4 there is illustrated a magnetic structure comprising a flat coil solenoid 26 which was tested in an attempt to provide a magnetic flux which was more uniformly parallel to the surface of the target 16 than that provided by the FIG. 1 structure. As indicated hereinbefore with respect to FIG. 1, disintegration of the cathode predominantly occurs where the lines of force are substantially parallel to the cathode surface—that is, at regions A'. However, the area over which the lines of force are substantially parallel is rather minimal and thus uneconomical utilization of the cathode results. The FIG. 4 embodiment did generate a desired type of parallel field (the illustration of which is approximate), but the ampere-turns required to generate sufficient magnetic flux (typically over 100 gauss at ¼ inch above the coil) was very high. Accordingly, the flat coil solenoid of FIG. 4 is not considered to be a preferred embodiment of the invention at this time.

Figure 2:
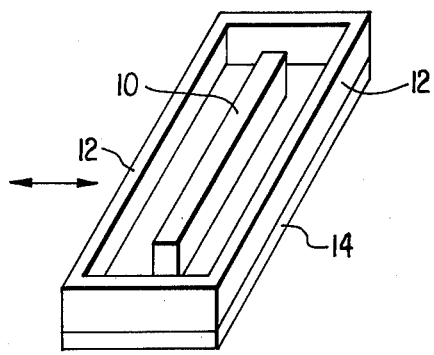
Figure 3:
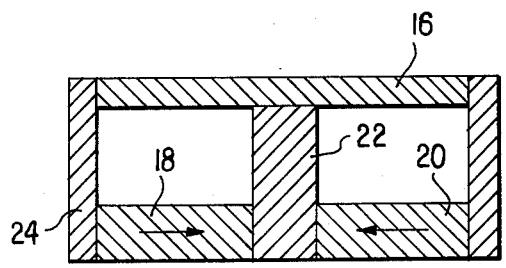
FIG. 3 is a cross-sectional view of another prior art device.

Referring to FIGS. 5 and 6, there is shown an illustrative permanent magnet structure which functionally approximates the FIG. 2 structure, where again the illustrative field is approximate. The structure comprises a plurality of flexible magnetic tapes 28 which are concentrically arranged or stacked to form a flat coil as shown in FIG. 6. Each ring of the coil comprises a strip of the tape where the ends of each strip abut one another as indicated at 30 for the outer ring. Together the strips are substantially equivalent to a solid magnet where the directions of the flux in each magnet are represented by arrows in FIG. 5 and where the north and south poles of this "solid" magnet are as shown, it being understood that the polarities shown are illustrative and may be reversed, if desired. Rather than employing concentric or stacked strips as shown in FIGS. 5 and 6, a single strip can be tightly wound to provide a spiral configuration which is also very effective. Typically, the strips of flexible magnetic tape are oriented ferrite impregnated rubber strips 1/16 inch or ⅛ inch thick. Further, rather than tapes, ferrite block magnets (typically 3/16 inch thick) may also be employed to construct a configuration corresponding to that of FIG. 6.

Sputter cathodes magnetically enhanced by the magnetic structures of the present invention possessed superior performance characteristics compared to those enhanced by the conventional FIG. 1 structure. They support extremely high density plasmas, give better than usual target utilization and provide higher power efficiency than conventionally achieved. They need no pole pieces, can be built at lower cost and promise longer maintenance free life time.

The rolled and stacked magnet assemblies differ from the conventional magnetic arrays in that they represent a "solid" magnet, as discussed above, rather than several individual magnets pieced together magnetically via the pole pieces or pole plates. The performance of the resulting cathodes is closely related to this "solid" form—especially in the corners 34 shown in FIGS. 7 and 8. A degree of corner integrity can be readily lost by any gaps between the layers of rubber magnet in the corners. Trying to wind a magnet to best fit a rectangle on the outside and gradually gapping the corners with magnetic material 36 as in FIG. 7 to generate a flattened elipse in the center will typically result in a much less powerful cathode than will a tight wound flattened elipse as shown in FIG. 8.

When the rubber strip is used in either a stacked or rolled construction several new factors are present. As indicated above, there is a unique advantage in establishing the "corner integrity" such that the plasma does not suffer corner losses as typically occurs with stacked block angled corners or square corners. Further, the electrical efficiency of the cathode increases—that is, more sputtering per watt-second of power consumed. Improvement is typically sufficient to give 1.5 to 3 times the usual sputter efficiency. There is also a uniquely greater stability to very high voltages and currents and to very low inert gas pressures. Full power operation is also obtained at pressure 10 times lower than usually required.

The power levels that can be supported by these cathodes at 2 microns of argon—or less, exceeds that previously observed by the inventor. Due to limitations of power supply capability and inability to adequately cool the target, the ultimate limitations imposed by the magnetic structures have not been determined. However, it has been observed that two to four times the usually employed power levels are readily attained without suggestion of a break in the E-I curve.

The flexible magnet materials also make possible many structures that would be most difficult and expensive to achieve in any other way. Even the FIG. 1 type of magnet structure can be given improved properties by interweaved stacking of the corners to provide "corner integrity" using the rubber strips. It may also be possible to achieve the corner integrity by use of permeable metal sheets between layers of blocks or strips in the corner regions.

In spite of the improvements effected by the FIG. 5 embodiments, they still suffer from uneven target utilization. Where the lines of flux enter the center line of the target at about 45° or more, there is no erosion of the target. At the outside edge prediction is less certain, for centrifical force seems to overcome any simple angle value. Full 90° is a safe value; however, this makes it possible to develop clamp rings and guards that stop erosion at any desired point, as will be discussed further hereinafter. The lack of erosion in the target center is of special concern due to the great cost of most of the targets. Increasing the area significantly eroded before any point erodes all the way through the target is thus of great importance. Accordingly, the magnetic structure illustrated in FIG. 9 may be employed whereby the magnets 28 are tipped away from the perpendicular orientation shown in FIG. 5. The angle of the magnets with respect to the perpendicular can fall within the 40°-60° range shown in FIG. 9 and preferably this angle should be 50°-55°. Special orientations of the magnets to change the pattern of erosion become quite easy when the flexible magnet system of the present invention is used. As the magnets are tipped toward the center, it is observed that the plasma is affected very little until approximately 40° is reached. At approximately this angle, depending upon the geometrics, field strengths, etc., a unique magnetic fused dome structure is formed at the target center line, the illustration of which is approximate. There appears to become but a single line of perpendicular flux where there had previously been about ½-1 inch or more of this. The flux lines branch out of this center line at angles of 45° or less. The result is a unique plasma flow situation where the opposing streams of plasma overlap the center line of the magnetics, providing erosion of the target across its center whereby the uniformity of target erosion may be improved with respect to that of the FIG. 5 embodiment. Although the magnets 28 as shown in FIG. 9 are polarized across the thin dimension thereof, it is to be understood that they may also be polarized along the width thereof—that is, from A to B as shown in FIG. 9.

A particularly preferred embodiment of the invention is illustrated in FIG. 10, this embodiment combining the effects provided by the structures of FIGS. 5 and 9. Accordingly with the embodiment of FIG. 10, the strength of the magnetic field above cathode 16 is enhanced by the perpendicular magnets 28' while the erosion of the target center is enhanced by the tipped magnets 28". Thus, for example, if the cathode has a width of 4 inches to 4¾ inches, the extent of magnets 28" on one side of the cathode might be ½ inch to ¾ inch, and the extent of magnets 28' might be one inch. To provide a continuous solid structure, a wedge-like insert 30 of magnetically permeable material is preferably disposed between the perpendicular magnets 28' and the tipped magnets 28". As indicated hereinbefore, clamp rings may be provided to stop erosion at the outer edge of the target. Such a ring is shown at 32 in FIG. 10 where the lines of force are perpendicular to the clamp rings. Further, such clamp rings may be useful in positioning the cathode structure of FIG. 10 within the sputtering device.

An attempt was made to construct very small structures corresponding to that of FIG. 1. It was found that at diameters less than about 1½ inches they would not work in that they would not support a stable magnetically enhanced plasma. At sufficiently high voltage they operated as sputter diodes, with no change in behavior noted in the presence or absence of the magnets. Such a structure is shown in FIG. 11 where the structure corresponds to that shown in FIG. 1 but where the distances between the magnets have been substantially decreased to provide a small sputtering device where the cathode typically has a diameter of one inch or less. Such small devices are useful in many applications.

It is thought the problem of center erosion and the problem of very small targets are one and the same. The radius of curvature for the plasma path may be a problem also. The electrons traveling tight corners need very high magnetic fields to keep them from centrifuging away from the cathode. A one inch diameter cathode as shown in FIG. 11 can be built using the most powerful ferrite magnets, although it is to be understood that the cathode of FIG. 11 may be elongated rather than circular if so desired. Under most conditions this will not perform in a magnetically enhanced mode. An iron filings picture which gives an indication of the positions of the lines of force provides an explanation. The trapping dome is very short, pushed down by strangely shaped lines of force from the outer half of the ring magnet. Making the center magnet stronger would help push up the dome, but the strongest commercially available ferrites are now being used. The dome must clear the target surface by at least ⅜ inch for the magnetic structure to be effective. Because of the quadrupole-like form above the magnet, the dome is very tightly defined. Changes in target height of a few thousandths of an inch change this from an unenhanced cathode to a violently effective enhanced one.

It can thus be seen that the small cathode structure of FIG. 11 has the same general quadrupole-like lines of force as the center effective units of FIGS. 9 and 10 obtained by tipping the magnets. As the small cathode field is reduced, or the cathode dimensions increased, the quadrupole effect becomes undetectable. Other magnetic structures may be employed to effect the quadrupole-like lines of force illustrated in FIGS. 5 and 9. Illustrative of such structures would be that of FIG. 12 which is also particularly applicable to small cathodes of either circular or elongated configuration. The magnetic structure includes a pair of C-magnets 40 and 42 in opposing polarity as shown in FIG. 12 where the polarity may be reversed if so desired. A pole piece 44 connects the lower arms of the magnets 40 and 42. A center magnet 46 is disposed between the magnets 40 and 42 where the polarity of the upper pole thereof is opposite that of the upper arms of the C-magnets and where the magnet 46 may be an extension of pole piece 44, if desired.

It is a general teaching of the FIG. 1 structures that the outer pole area should be approximately the same as the inner pole area. In the structures of FIGS. 9, 10 and 11, this teaching has been totally violated. In tipping the magnets in the FIGS. 9 and 10 structures, the lines of force are projected upward from the outer edges, the return path being closed off down the center. In the smaller structure of FIG. 11, the pole areas are loaded ≈10:1 outside to inside. The results are unique.

Placing a steel pole piece in the center and/or around the outside edges of the cathode has almost no effect on the performance of the cathodes of this invention. The unique effects are almost totally caused by the form factor created by the stacking. The form factor can be improved even further (with some loss of flux) through the use of thin magnetic shunts 38 as shown in FIG. 13, which shows thin steel shunts 38 placed just out of magnetic contact with the magnet edge surface. The gauss level parallel to the target surface (about 3/16 inch above the surface seems to be the most meaningful indication) is shown with and without the shunt in FIG. 14. The presence of the correct thickness (typically 0.005–0.015 inch) and width of shunt provides a significantly wider path of maximum erosion. A heavy shunt destroys the pattern.

Modifying the cross section depth of the magnets can also be used to help shape the parallel gauss curve and thus the erosion pattern indicated at "x" in FIG. 14. Further, there appears to be many ways the stacked and rolled parallel and tipped magnetic structures of the present invention can be varied to influence target utilization and other performance criteria. Combinations of these effects can also be useful.

It should also be noted it has been a consistent teaching of the prior art in the magnetically enhanced sputtering field that it was necessary to provide a continuous line of force loop system to provide significant plasma enhancement, the loop, as stated hereinbefore, being defined in the FIG. 1 embodiment above cathode 16 between inner magnet 10 and outer magnet 12. With the flexible strips of the present invention it can be shown that unique and productive configurations can be assembled that are in opposition to this. In fact, unusually wide and uniform sputtering patterns can be obtained in cases where there is intentional disruption of the "race track" type of pattern. By stacking an inch or more thick of long rubber magnet strips, they can be folded, wound and twisted to explore configurations where the ends do not meet end to end. Especially effective is the configuration where an end butts 90° to a side. At such an intersection (of the correct polarities) the plasma forms a 90° corner—full into the corner—and spreads to the full width of the 45° limits of the line of force pattern. This wide plasma seems to be compressed by negotiating corners—as might be predicted from centrifugal force and continuing acceleration in the corners. Such configurations may lead to increased target utilization and refinements far removed from the prior art.

What is claimed is:

1. In a planar magnetron sputtering device including a cathode of target material to be sputtered; wherein said cathode includes a planar sputtering surface, at least a portion of which is disposed about a center line perpendicular to the plane of said surface, an anode adapted for establishing an accelerating electric field between said anode and cathode and magnetic means for establishing a magnetic field adjacent the planar sputtering surface of said cathode for lengthening the path traveled by electrons removed from said cathode; and wherein the lines of force of the magnetic field extend over the planar sputtering surface of said cathode and pass through the cathode in the vicinity of said center line, the improvement where said magnetic means comprises means for causing a majority of said magnetic lines of force to pass through said cathode in the vicinity of said center line at angles of 45° or less with respect to said planar sputtering surface to thereby enhance the uniformity of cathode erosion.

2. The improvement as in claim 1 where substantially all of said magnetic lines of force pass through said cathode in the vicinity of said center line at angles of 45° or less.

3. The improvement as in claim 1 including a magnetic shunt plate disposed between said magnetic means and said cathode.

4. The improvement as in claim 1 where said cathode has disposed about the periphery thereof clamping means.

5. The improvement as in claim 1 where said magnetic means includes a first plurality of strips of magnetized tape disposed on the side of said cathode opposite said planar sputtering surface; wherein each strip is in substantial contact with and at least partially overlaps at least one of the strips adjacent it and where at least some of the strips near the vicinity of said center line of the cathode are disposed at an angle of 40°-60° with respect to the perpendicular to said planar sputtering surface, whereby a substantially solid magnetic structure is formed by said plurality of strips, the structure extending toward said center line and parallel to said planar sputtering surface.

6. The improvement as in claim 5 wherein said angle is 50°-55°.

7. The improvement as in claim 5 where said plurality of strips substantially extends to the center line of the cathode.

8. The improvement as in claim 5 including a second plurality of said strips of magnetized tape where said first and second pluralities of strips are disposed on opposite sides of said center line of the cathode; wherein the flux direction within said first plurality of strips is opposite to that within said second plurality of strips.

9. The improvement as in claim 5 where the width of at least one of said strips is different from the widths of the remaining strips to thereby impart a variable width shape to said magnetic structure.

10. The improvement as in claim 5 where at least some of the strips removed from the vicinity of the center line of the cathode are substantially perpendicularly disposed with respect to said planar sputtering surface.

11. The improvement as in claim 10 where the strips removed from the vicinity of the center line are disposed near the outer edge of said cathode.

12. The improvement as in claim 10 where a wedge of magnetically permeable material is disposed between (a) the strips that are perpendicularly oriented with respect to the planar sputtering surface and (b) the strips that are disposed at an angle of 40°-60° with respect to a perpendicular to said planar sputtering surface.

13. The improvement as in claim 5 where the ends of each said strip are in contacting relationship to thereby form a closed loop.

14. The improvement as in claim 13 where said strip ends are perpendicularly disposed with respect to one another.

15. The improvement as in claim 5 where the ends of each said strip are in non-contacting relationship to thereby form an open loop.

16. The improvement as in claim 1 where said magnetic means includes a plurality of magnets separated from one another and connected by pole pieces.

17. The improvement as in claim 16 where the distance from one edge to the edge opposite said center line is not more than one inch.

18. The improvement as in claim 16 where said magnetic means causes a dome-like configuration of magnetic lines to occur over said center line, the top of said dome-like configuration being at least ⅜ inch above the cathode planar sputtering surface.

19. The improvement as in claim 1 where said magnetic means includes a plurality of strips of magnetized tape concentrically disposed on the side of said cathode opposite said planar sputtering surface where each strip is in substantial contact with and at least partially overlaps at least one of the strips adjacent it and where at least some of the strips near the vicinity of said center line of the cathode are disposed at an angle of 40°-60° with respect to the perpendicular to said planar surface so that a substantially solid, flat coil is formed by said plurality of strips, the coil being parallel to said planar sputtering surface and disposed substantially symmetrical with respect to said center line.

20. The improvement as in claim 19 where each strip closely contacts the strips adjacent it at least in the curved portions of said coil.

21. The improvement as in claim 1 where said magnetic means includes a wound strip of magnetized tape having a coil-like configuration disposed on the side of said cathode opposite said planar sputtering surface; wherein each turn of the coil is in substantial contact with and at least partially overlaps at least one of the turns adjacent it and where at least some of the turns near the vicinity of said center line of the cathode are disposed at an angle of 40°-60° with respect to the perpendicular to said planar surface so that a substantially solid, flat coil is formed by said wound strips, the coil being parallel to said planar sputtering surface and disposed substantially symmetrical with respect to said center line.

22. The improvement as in claim 21 where each turn closely contacts the turns adjacent it at least in the curved portions of the coil.

23. In a planar magnetron sputtering device including a cathode of target material to be sputtered; wherein said cathode includes a planar sputtering surface, at least a portion of which is disposed about a center line perpendicular to the plane of said surface, an anode adapted for establishing an accelerating electric field between said anode and cathode and magnetic means for establishing a magnetic field adjacent the planar sputtering surface of said cathode for lengthening the path traveled by electrons removed from said cathode; and wherein the lines of force of the magnetic field extend over the planar sputtering surface of said cathode and pass through the cathode in the vicinity of said center line, the improvement where said magnetic means includes a plurality of strips of magnetized tape concentrically disposed on the side of said cathode opposite said planar sputtering surface; wherein each strip is in substantial contact with and at least partially overlaps at least one of the strips adjacent it so that a substantially solid, flat coil is formed by said plurality of strips, the coil being parallel to said planar surface and disposed substantially symmetrical with respect to said center line.

24. The improvement as in claim 23 where at least some of the strips are perpendicularly oriented with respect to said planar sputtering surface.

25. The improvement as in claim 23 where at least some of the strips near the vicinity of said center line are disposed at an angle of 40°-60° with respect to the perpendicular to said planar sputtering surface.

26. The improvement as in claim 25 where said angle is 50°-55°.

27. The improvement as in claim 23 where said plurality of strips substantially extends to the center line of the cathode.

28. The improvement as in claim 23 where at least some of the strips removed from the vicinity of the center line of the cathode are substantially perpendicularly disposed with respect to said planar sputtering surface.

29. The improvement as in claim 28 where the strips removed from the vicinity of the center line are disposed near the outer edge of said cathode.

30. The improvement as in claim 28 where a wedge of magnetically permeable material is disposed between (a) the strips that are perpendicularly oriented with respect to the planar sputtering surface and (b) the strips that are disposed at an angle of 40°-60° with respect to a perpendicular to said planar sputtering surface.

31. The improvement as in claim 23 where said cathode has disposed about the periphery thereof clamping means.

32. The improvement as in claim 23 where each strip closely contacts the strips adjacent it at least in the curved portions of said coil.

33. In a planar magnetron sputtering device including a cathode of target material to be sputtered; wherein said cathode includes a planar sputtering surface, at least a portion of which is disposed about a center line perpendicular to the plane of said surface, an anode adapted for establishing an accelerating electric field between said anode and cathode and magnetic means for establishing a magnetic field adjacent the planar sputtering surface of said cathode for lengthening the path traveled by electrons removed from said cathode; and wherein the lines of force of the magnetic field extend over the planar sputtering surface of said cathode and pass through the cathode in the vicinity of said center line, the improvement where said magnetic means includes a wound strip of at least one magnetized tape having a coil-like configuration disposed on the side of said cathode opposite said planar sputtering surface; wherein each turn of the coil is in substantial contact with and at least partially overlaps at least one of the turns adjacent it so that a substantially solid, flat coil is formed by said wound strip, the coil being parallel to said planar sputtering surface and disposed substantially symmetrical with respect to said center line.

34. The improvement as in claim 33 where at least some of the turns are perpendicularly oriented with respect to said planar sputtering surface.

35. The improvement as in claim 33 where at least some of the turns near the vicinity of said center line are disposed at an angle of 40°-60° with respect to the perpendicular to said planar sputtering surface.

36. The improvement as in claim 35 where said angle is 50°-55°.

37. The improvement as in claim 33 where said coil-like configuration substantially extends to the center line of the cathode.

38. The improvement as in claim 33 where at least some of the turns removed from the vicinity of the center line of the cathode are substantially perpendicularly disposed with respect to said planar sputtering surface.

39. The improvement as in claim 38 where the turns removed from the vicinity of the center line are disposed near the outer edge of said cathode.

40. The improvement as in claim 38 where a wedge of magnetically permeable material is disposed between (a) the turns that are perpendicularly oriented with respect to the planar sputtering surface and (b) the turns that are disposed at an angle of 40°-60° with respect to a perpendicular to said planar sputtering surface.

41. The improvement as in claim 33 where said cathode has disposed about the periphery thereof clamping means.

42. The improvement as in claim 33 where each turn closely contacts the turns adjacent it at least in the curved portions of the coil.

* * * * *